United States Patent
Winarski

(10) Patent No.: US 6,688,053 B2
(45) Date of Patent: Feb. 10, 2004

(54) DOUBLE-PANE WINDOW THAT GENERATES SOLAR-POWERED ELECTRICITY

(76) Inventor: Tyson Winarski, 428 E. Susan La., Tempe, AZ (US) 85281

(*) Notice: Subject to any disclaimer, the term of this patent is extended or adjusted under 35 U.S.C. 154(b) by 42 days.

(21) Appl. No.: 10/184,144

(22) Filed: Jun. 27, 2002

(65) Prior Publication Data

US 2004/0000106 A1 Jan. 1, 2004

(51) Int. Cl.⁷ .............................................. E04D 13/18
(52) U.S. Cl. ...................................... 52/173.3; 136/251
(58) Field of Search ........................... 52/173.3, 786.11; 136/251, 246; 126/684, 651, 701, 702

(56) References Cited

U.S. PATENT DOCUMENTS

| | | | | |
|---|---|---|---|---|
| 4,663,495 A | * | 5/1987 | Berman et al. | 136/248 |
| 5,228,925 A | * | 7/1993 | Nath et al. | 136/251 |
| 5,482,569 A | * | 1/1996 | Ihara et al. | 136/251 |
| 6,423,894 B1 | * | 7/2002 | Patz et al. | 136/244 |
| 6,528,718 B2 | * | 3/2003 | Yoda et al. | 136/251 |
| 6,553,729 B1 | * | 4/2003 | Nath et al. | 52/173.3 |

OTHER PUBLICATIONS

The Internet website for the commercially available Nikon V–1A is: http://www.microscopyu.com/articles/fluorescense/filtercubes/ffcv 1a.html.
The Internet website for the commercially available DST family of dichronic mirror beamsplitters is: http://www.pgo-online.com/intl/katalog/dst.html.

* cited by examiner

Primary Examiner—Carl D. Friedman
Assistant Examiner—Basil Katcheves
(74) Attorney, Agent, or Firm—Tyson York Winarski, Esq.

(57) ABSTRACT

A double-pane window houses solar cells and dichronic mirrors. The dichronic mirrors reflect a portion of light onto the solar cells for the generation of electricity while transmitting the remainder of the light through the dichronic mirrors so that the interior of buildings is illuminated and the occupants of these buildings can have an outside view.

18 Claims, 10 Drawing Sheets

US 6,688,053 B2

DOUBLE-PANE WINDOW THAT GENERATES SOLAR-POWERED ELECTRICITY

FIELD OF THE INVENTION

The present invention relates to the field of solar generated electricity.

BACKGROUND OF THE INVENTION

The traditional use of panels of solar cells have not realized their full potential because the electricity produced by these panels of solar cells is more expensive than that generated by the consumption of fossil fuels.

Glass panes are a very common exterior feature of skyscrapers, high-rise office buildings, and apartment buildings. Glass panes afford views for the workers and occupants in the high-rise buildings. Additionally, glass panes permit sunlight to enter the building, to illuminate its interior.

Via dichronic mirrors, this invention uses solar cells between the glass panes of double-pane windows to produce solar generated electricity while preserving the views afforded by glass panes themselves. These electricity-producing double-pane windows could be used in any structure, such as a home or trailer, as well as a high-rise building. However, these electricity-producing double-pane windows are particularly advantageous to high-rise buildings where there is so much glass in use.

SUMMARY OF THE INVENTION

The present invention provides a sealed double-pane window that also serves as a power source because the double-pane window houses a plurality of solar cells. More specifically, this invention uses dichronic mirrors to direct specific wavelengths of solar energy onto narrow strips of solar cells. Dichromatic mirrors are also known as beam-splitters. The use of dichronic mirrors allows the solar cells to be placed edge-on relative to the viewer looking out from the building. Thus, the viewer sees the thin dimension of each solar cell. Additionally, the dichronic mirror allows those wavelengths of light not reflected onto the solar cell to pass through the dichronic mirror and into the building, so that a person has a view of the outside world and light enters the building.

DESCRIPTION OF THE PREFERRED EMBODIMENTS

While the invention has been shown and described with reference to a particular embodiment thereof, it will be understood to those skilled in the art, that various changes in form and details may be made therein without departing from the spirit and scope of the invention.

Figure 1:
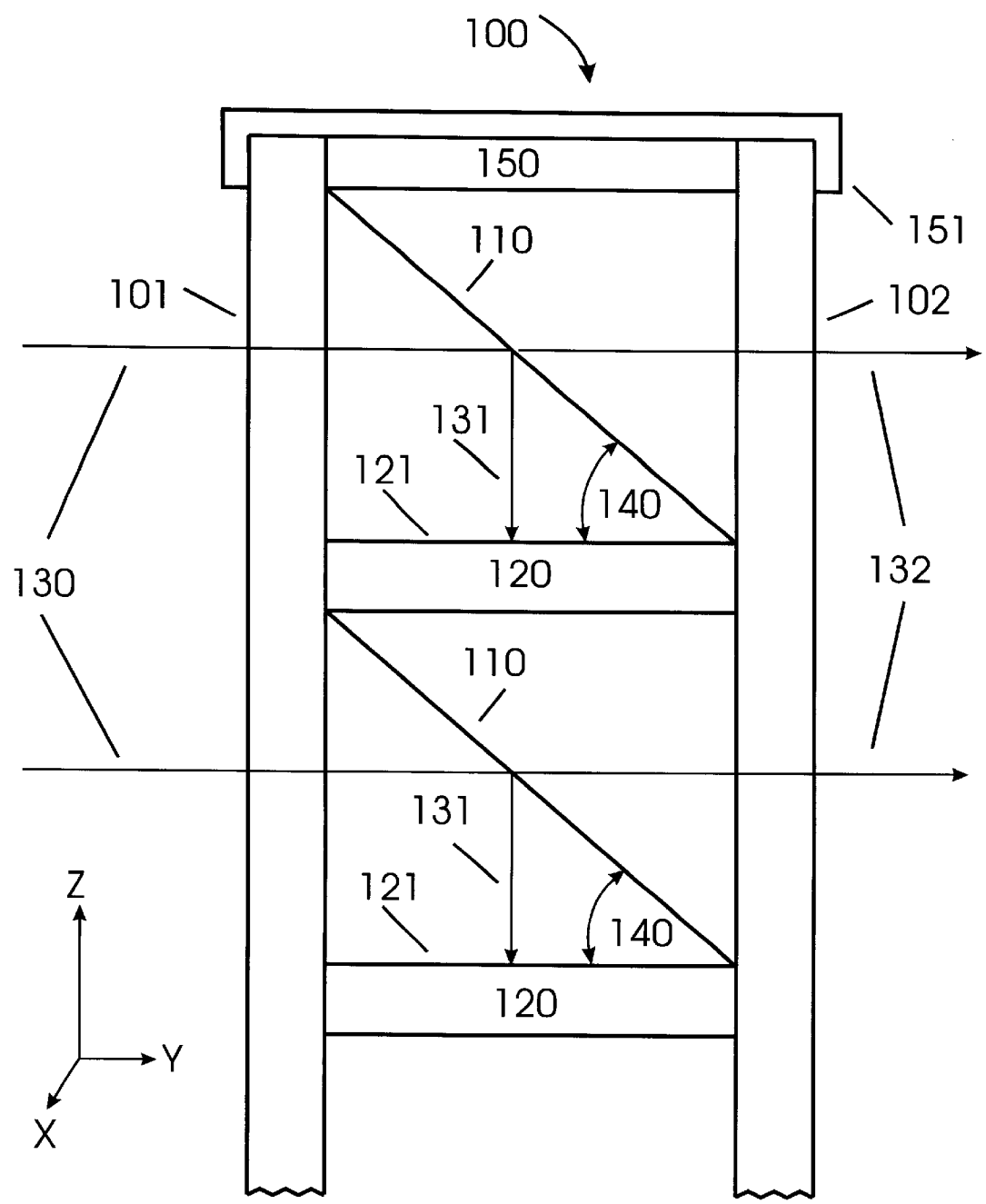
FIG. 1 illustrates a side view of a cross-section of a double-pane window with horizontal strips of solar cells.

FIG. 1 illustrates a side view of a cross-section of a double-pane window 100 which has exterior pane 101 and interior pane 102. Double-pane window 100 could equally be called a dual-pane window. Exterior pane 101 and interior pane 102 are preferably flat panes and preferably made of glass. However, exterior pane 101 and interior pane 102 could be comprised of other materials, such as polycarbonate or acrylic. Exterior pane 101 and interior pane 102 are each parallel to the X-Z vertical plane shown in FIG. 1. The X and Y axes in FIG. 1 are in the horizontal plane, with the Y axis pointing from exterior pane 101 towards interior pane 102 of double-pane window 100. The Z axis is parallel to the vertical direction and the Z axis is preferably pointing in the vertically-upwards direction.

Double-pane window 100 is sealed against contaminants such as dust, dirt, and debris by seal 151 which runs along the outer perimeter of double-pane window 100. In conjunction with seal 151, spacer 150 also runs along the outer perimeter of double-pane window 100 to keep exterior pane 101 and interior pane 102 uniformly spaced. Seal 151 and spacer 150 preferably have the same thermal coefficient of expansion so that during diurnal and seasonal temperature changes, the seal is maintained. A typical material for seal 151 and spacer 150 is aluminum. A thin elastomeric coating on seal 151 and spacer 150, such as polytetrafluoroethylene, may be used to augment the sealing.

In between exterior pane 101 and interior pane 102 are a plurality of solar cells 120 and a plurality of dichronic mirrors 110. As shown in FIG. 1, solar cells 120 lie in the X-Y horizontal plane and are perpendicular to exterior pane 101 and interior pane 102. Dichronic mirrors 110 receives exterior light 130 and reflects a portion of light 130, as light 131, onto surfaces 121 of solar cells 120. Additionally, dichronic mirrors 110 allows a portion of light 130, as light 132, to be transmitted through dichronic mirrors 110.

Each dichronic mirror 110 is paired with a corresponding solar cell 120. Additionally, each dichronic mirror 110 makes an acute angle 140 with respect to each surface 121 of each solar cell 120. Angle 140 is preferably between 45 and 60 degrees for East and West facing windows. Angle 140 is preferably [90−(latitude/2)]+/−20 degrees for South facing windows, where latitude is the latitude in degrees of where double-pane window 100 is used. The further North the latitude, the closer that angle 140 approaches 45 degrees for South facing windows.

Those portions of spacer 150, which run along the left and right sides of double-pane window 100, have slots to hold solar cells 120 and dichronic mirrors 110 in place. Additionally, solar cells 120 may fit into optional horizontal slots molded or etched into exterior pane 101 and interior pane 102. Alternately, solar cells 120 may be glued to exterior pane 101 and interior pane 102 by an adhesive, such as epoxy.

Because the thickness dimension of solar cells 120 is small, the amount of exterior light 130 blocked by solar cells 120 is small. Dichronic mirrors 110 reflect a portion of light 130 to be reflected as light 131 onto solar cells 120 respectively. However, dichronic mirrors 110 also transmit a portion of light 130 to be transmitted, as light 132. Thus, double-pane window 100 is capable of generating electricity while allowing light to enter a building. This allows light 132 to illuminate the interior of the building and permits the occupant of that building to look outside, while solar-generated electricity is produced via light 131.

Figure 2:
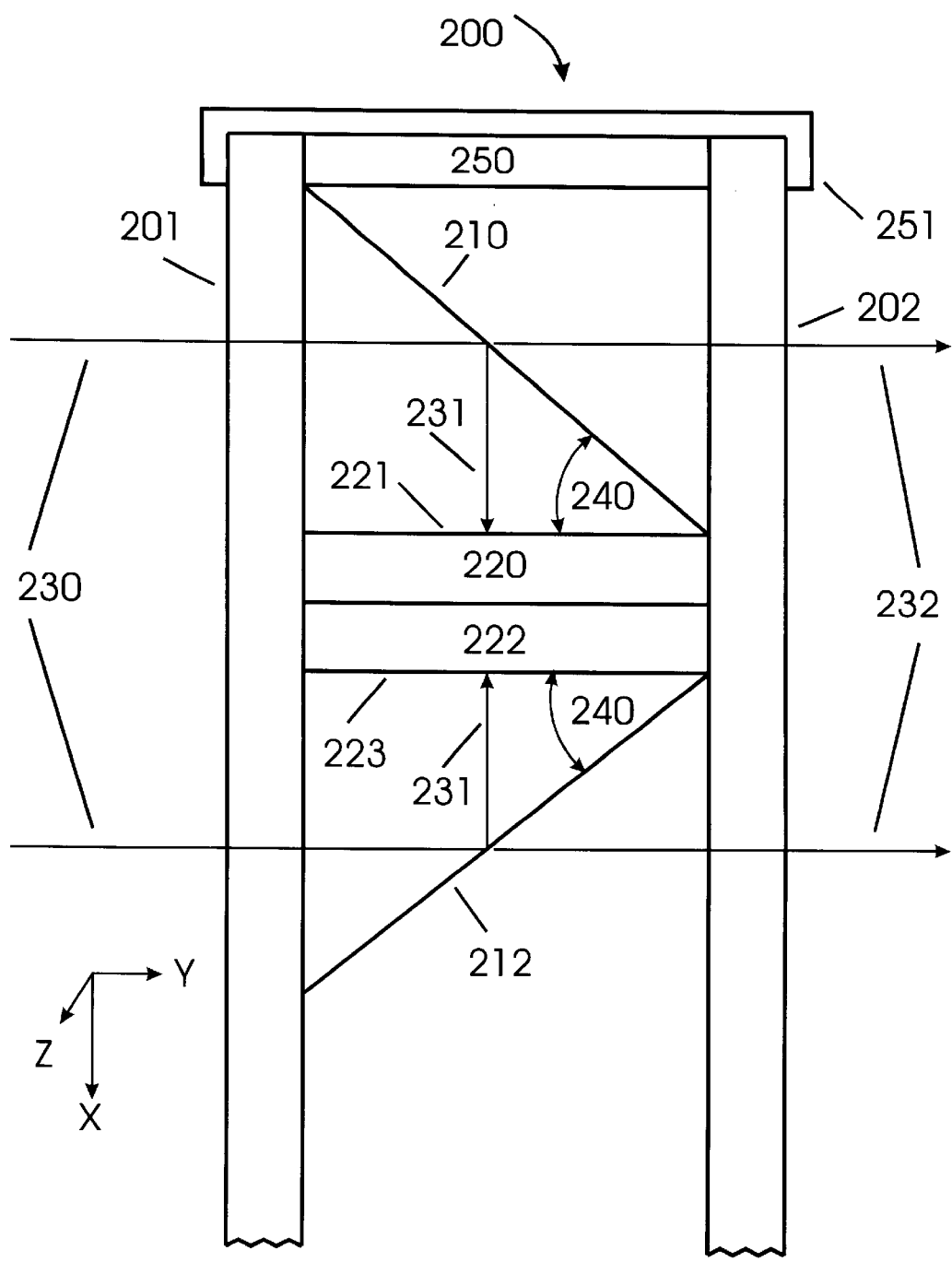
FIG. 2 illustrates a top view of a cross-section of a double-pane window with vertical strips of solar cells.

FIG. 2 illustrates a top view of a cross-section of a double-pane window 200 which has exterior pane 201 and interior pane 202. Exterior pane 201 and interior pane 202 are preferably glass. However, exterior pane 201 and interior pane 202 could be comprised of other materials, such as polycarbonate or acrylic. Exterior pane 201 and interior pane 202 are each parallel to the X-Z vertical plane shown in FIG. 2. The X and Y axes in FIG. 2 are in the horizontal plane, with the Y axis pointing from exterior pane 201 towards interior pane 202 of double-pane window 200. The Z axis is parallel to the vertical direction and the Z axis is preferably pointing in the vertically upwards direction.

Double-pane window 200 is sealed against contaminants such as dust, dirt, and debris by seal 251 which runs along the outer perimeter of double-pane window 200. In conjunction with seal 251, spacer 250 also runs along the outer perimeter of double-pane window 200 to keep exterior pane 201 and interior pane 202 uniformly spaced. Seal 251 and spacer 250 preferably have the same thermal coefficient of expansion so that during diurnal and seasonal temperature changes, the seal is maintained. A typical material for seal 251 and spacer 250 is aluminum. A thin elastomeric coating on seal 251 and spacer 250, such as polytetrafluoroethethylene, may be used to augment the sealing.

In between exterior pane 201 and interior pane 202 are a plurality of solar cells 220 and 222 and a plurality of dichronic mirrors 210 and 212. As shown in FIG. 2, solar cells 220 and 222 lie in the Y-Z vertical plane and are perpendicular to exterior pane 201 and interior pane 202. Dichronic mirror 210 receives exterior light 230 and reflects a portion of light 230, as light 231, onto surface 221 of solar cell 220. Additionally, dichronic mirror 210 allows a portion of light 230, as light 232, to be transmitted through dichronic mirror 210. Similarly, dichronic mirror 212 receives exterior light 230 and reflects a portion of light 230, as light 231, onto surface 223 of solar cell 222 while transmitting a portion of light 230, as light 232, through dichronic mirror 212.

Each dichronic mirror 220 and 222 in FIG. 2 makes an acute angle 240 with respect to surfaces 221 and 223 of solar cells 220 and 222, respectively. Angle 240 is preferably 45 degrees and ranges between 40 and 50 degrees.

Those portions of spacer 250, which run along the top and bottom ends of double-pane window 200, have slots to hold solar cells 220 and 222 as well as dichronic mirrors 210 and 212 in place. Additionally, solar cells 220 and 222 may fit into optional vertical slots molded or etched into exterior pane 201 and interior pane 202. Alternately, solar cells 220 and 222 may be glued to exterior pane 201 and interior pane 202 by an adhesive, such as epoxy.

Because the thickness dimension of solar cells 220 and 222 is small, the amount of exterior light 230 blocked by solar cells 220 and 222 is small. Dichronic mirrors 210 and 212 reflect a portion of light 230, as light 231, onto solar cells 220 and 222 respectively. However, dichronic mirrors 210 and 212 also permit a portion of light 230, as light 232, to be transmitted through dichronic mirrors 210 and 212. Thus, double-pane window 200 is capable of generating electricity while allowing light to enter a building. This allows light 232 to illuminate the interior of the building and permits the occupant of that building to look outside, while solar-generated electricity is produced via light 231.

In FIG. 1, solar cells 120 are not adjacent and solar cells 120 lie in the X-Y horizontal plane. Surfaces 121 of solar cells 120 are all facing the vertically upwards direction. Additionally, dichronic mirrors 110 all reflect a portion of light 130, as light 131, downward towards upward facing surfaces 121 of solar cells 120. In contrast, FIG. 2 shows solar cells 220 and 222 as adjacent and solar cells 220 and 222 lie in the vertical Y-Z plane. Surfaces 221 and 223, of adjacent solar cells 220 and 222 respectively, face in opposite directions along horizontal axis X. Finally, dichronic mirrors 210 and 212 reflect a portion of light 230, as light 231, in opposite directions along horizontal X axis, towards oppositely facing surfaces 221 and 223 of solar cells 220 and 222, respectively. Thus, FIGS. 1 and 2 use the same electro-optical physics, but in different geometric arrangements.

Figure 3:
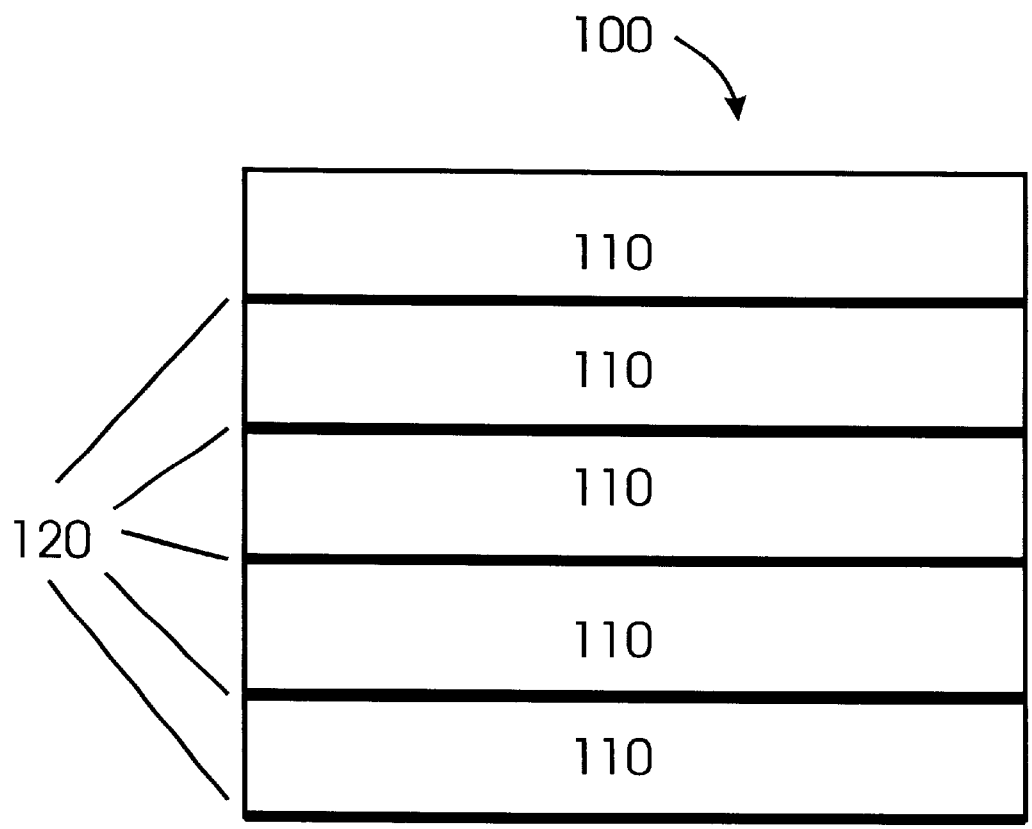
FIG. 3 illustrates a frontal view of a double-pane window with horizontal strips of solar cells.

FIG. 3 illustrates a frontal view of double-pane window 100 with horizontal strips of solar cells 120. FIG. 3 shows a plurality of dichronic mirrors 110, each dichronic mirror paired with a solar cell 120.

Figure 4:
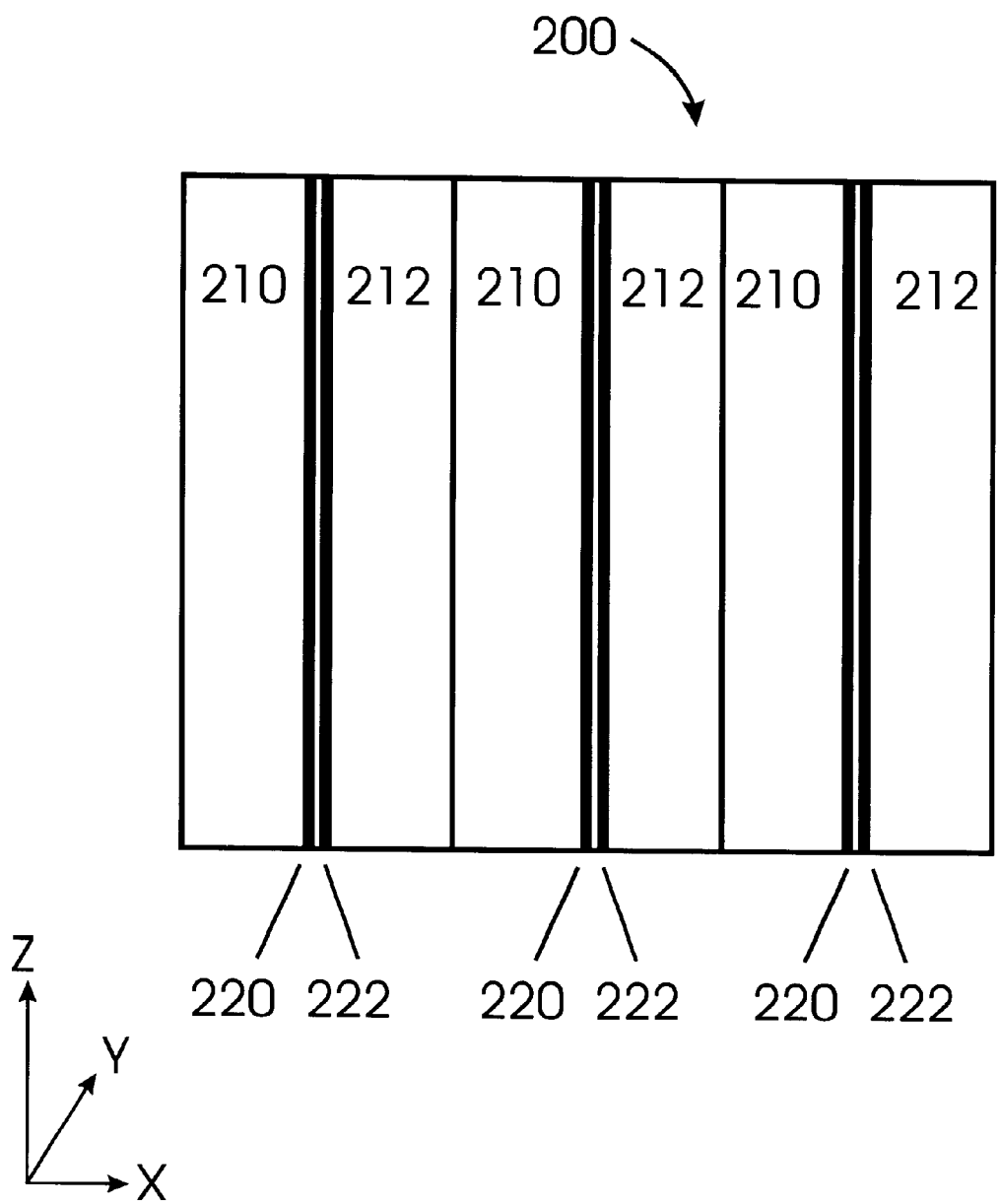
FIG. 4 illustrates a frontal view of a double-pane window with vertical strips of solar cells.

FIG. 4 illustrates a frontal view of double-pane window 200 with vertical strips of solar cells 220 and 222. FIG. 4 depicts a plurality of dichronic mirrors 210 and 212 paired with solar cells 220 and 222, respectively. In FIG. 4, solar cells 220 and 222 are preferably adjacent one another, as detailed in FIG. 2.

Figure 5:
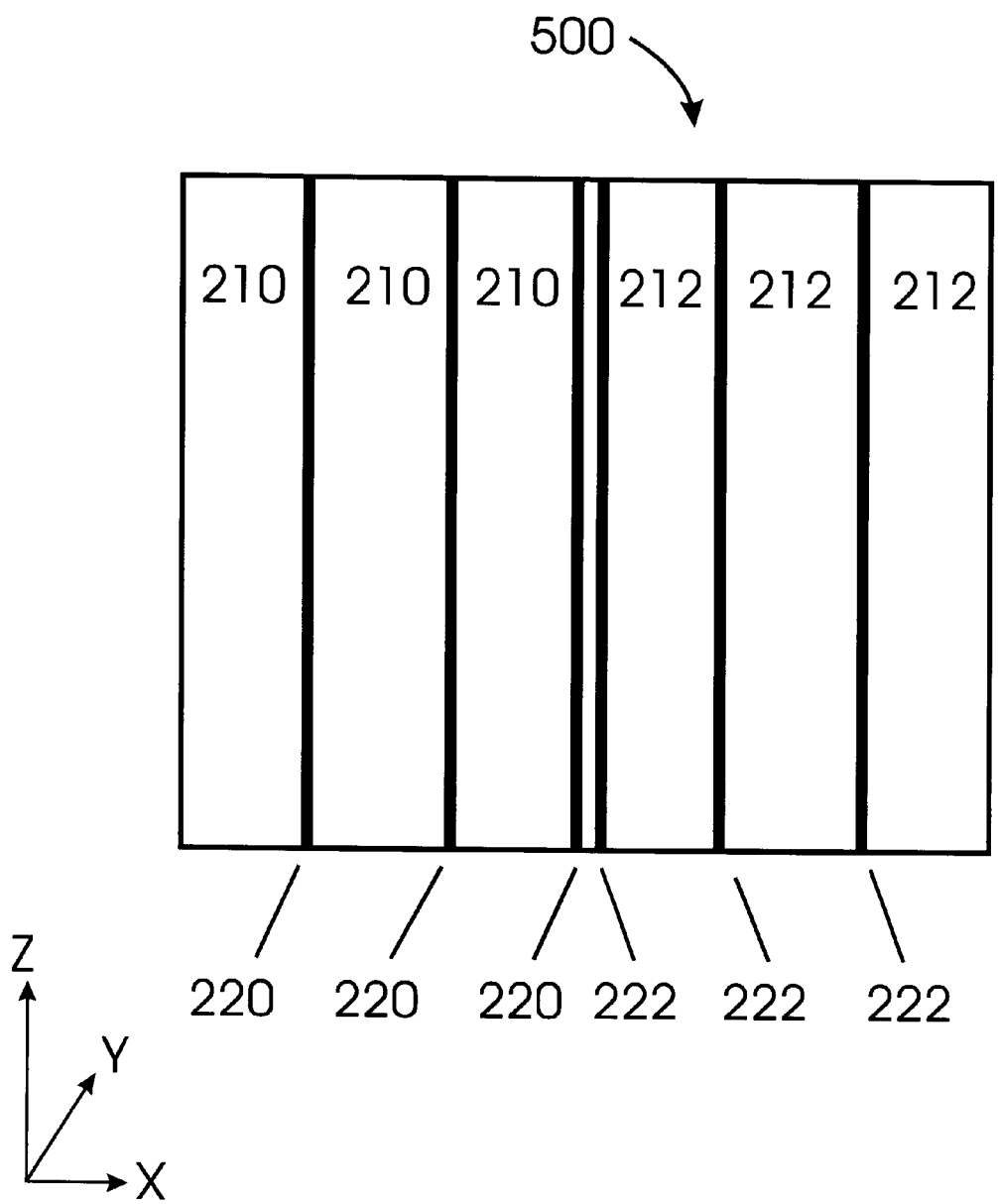
FIG. 5 illustrates a frontal view of a double-pane window with an alternate arrangement of vertical solar cells and dichronic mirrors.

FIG. 5 illustrates an alternate arrangement of vertical strips of solar cells 220 and 222 and dichronic mirrors 210 and 212 in frontal view of double-pane window 500, which is just a rearrangement of solar cells and dichronic mirrors of the double pane window 200 of FIG. 4. FIG. 5 depicts a plurality of dichronic mirrors 210 paired with solar cells 220 and dichronic mirrors 212 paired with solar cells 222. However, unlike FIG. 4, solar cells 220 and 222 need not be adjacent one another. In FIG. 5, solar cells 220 and dichronic mirrors 210 are all on the left-hand side, and solar cells 222 and dichronic mirrors 212 are all on the right-hand side of double-pane window 500.

Figure 6:
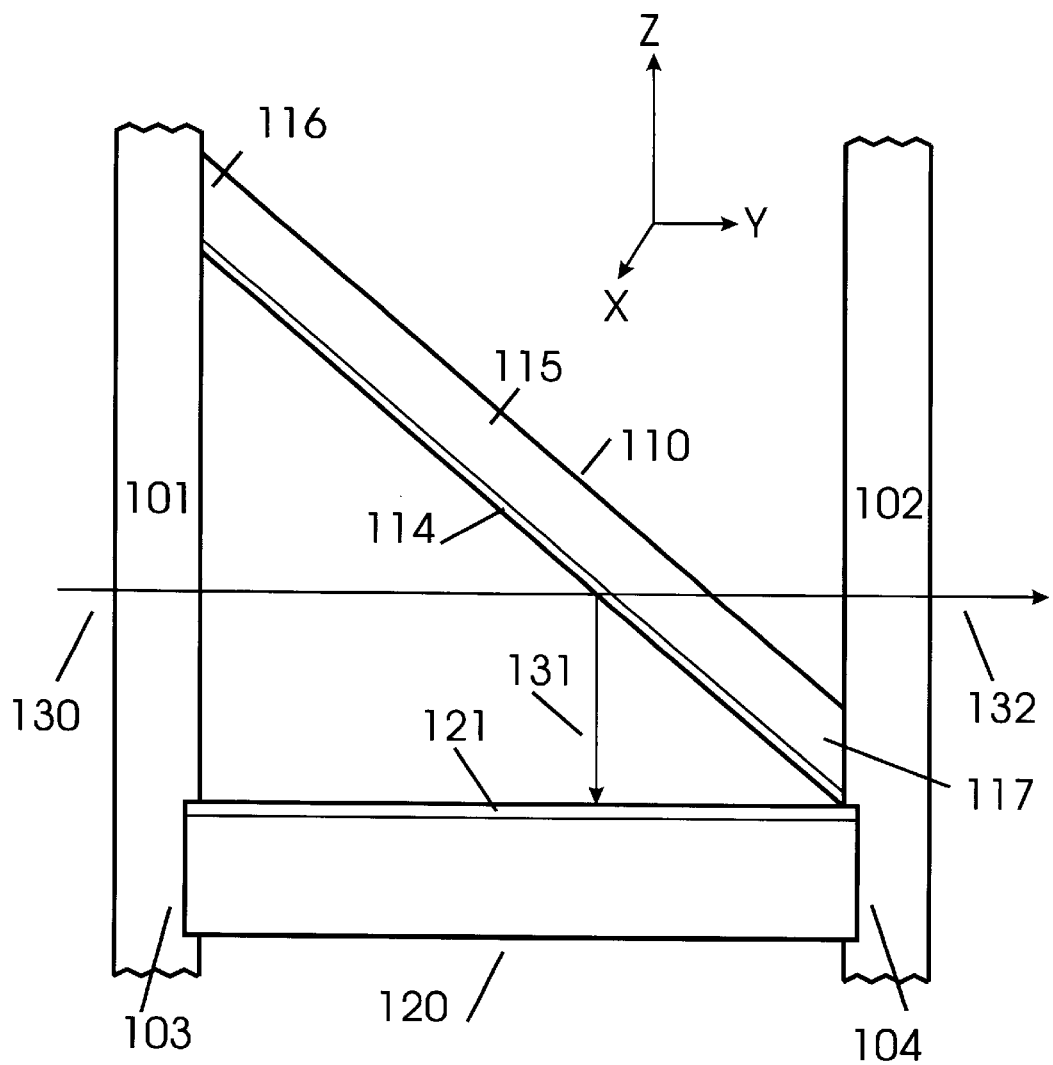
FIG. 6 illustrates additional detail for solar cells and dichronic mirrors.

FIG. 6 illustrates additional detail for dichronic mirror 110 and solar cell 120, as well as exterior pane 101 and interior pane 102. Dichronic mirror 110 is formed by coating transparent substrate 115 with dichronic coating 114. Substrate 115 is preferably glass. However, substrate 115 could be other transparent materials such as polycarbonate or acrylic. Dichronic coating 114 receives incoming light 130 and reflects a portion of light 132 while transmitting the remaining portion of light 131 to surface 121 of solar cell 120. Dichronic coating 114 is preferably a first-surface coating, meaning that incoming light 130 hits dichronic coating 114 first, without having to traverse substrate 115.

In FIG. 6, slot 103 in exterior pane 101 and slot 104 in exterior pane 102 are used to hold solar cell 120 in place. Alternately, or in addition, an adhesive such as epoxy could be used to hold solar cell 120 in place. Dichronic mirror may have beveled ends 116 and 117 to assist the proper placement of dichronic mirror 110 between exterior pane 101 and interior pane 102.

Figure 7:
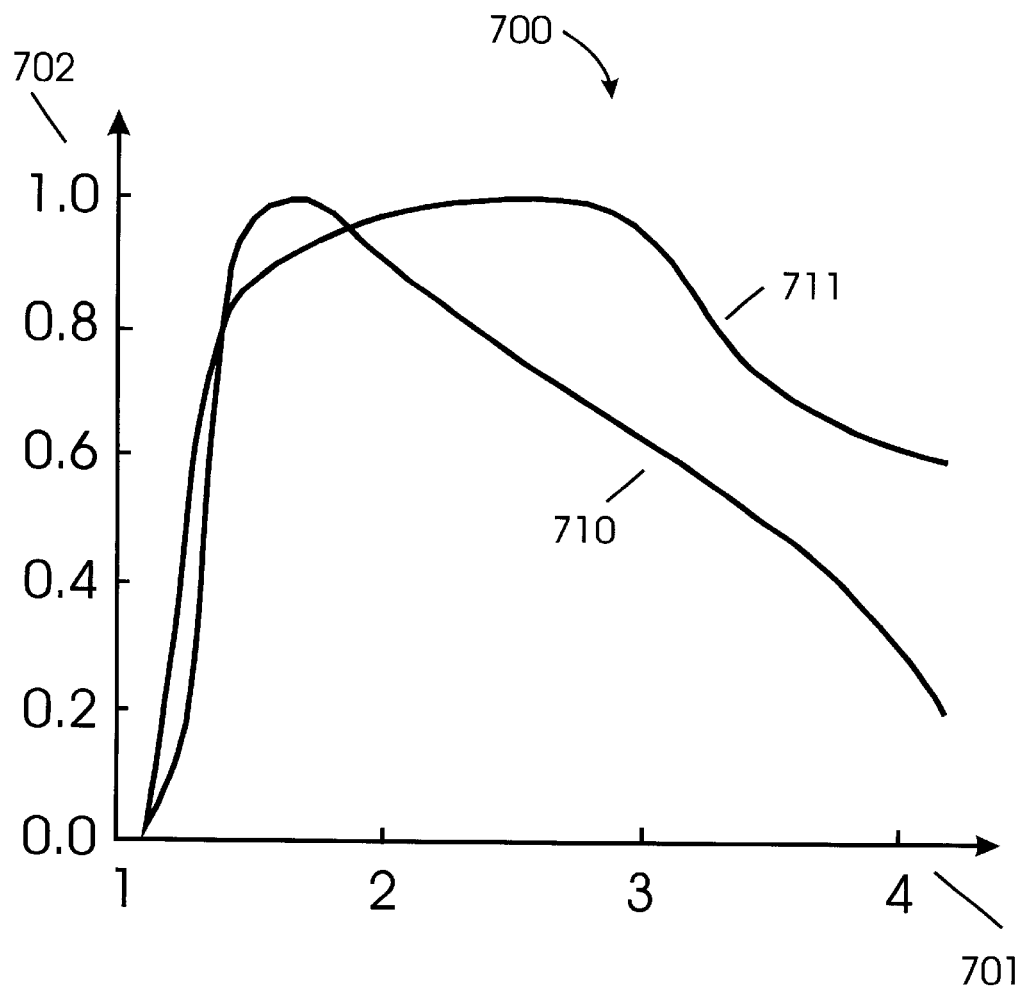
FIG. 7 illustrates the spectral response versus photon energy for a typical solar cell and a violet-responsive solar cell.

Surfaces 121, 221, and 223 of solar cells 120, 220, and 222 respectively, can have special spectral-response properties, as depicted in FIG. 7. FIG. 7 illustrates plots of spectral-response 702 versus photon energy in electron volts 701 for a typical n-p Silicon solar cell 710 and a violet-responsive solar cell 711. The surface of typical solar cell 710 in FIG. 7, which is in the same location as surfaces 121, 221, and 223 of solar cells 120, 220, and 222 respectively, has a depth of 0.4 micrometers and a surface doping of 5*10E19 per cubic centimeter. The notation 10E19 represents 10 to the 19$^{th}$ power. However, surface of violet-responsive solar cell 711, which is in the same location as surfaces 121, 221, and 223 of solar cells 120, 220, and 222 respectively, has a shallower depth of 0.2 micrometers and an order of magnitude lower surface doping of 5*10E18 per cubic centimeter. This shallower depth and lower surface doping gives violet-responsive solar cell 711 a much higher spectral response in the violet range, photon energy greater than 2.9 electron volts, than typical solar cell 710.

Figure 8:
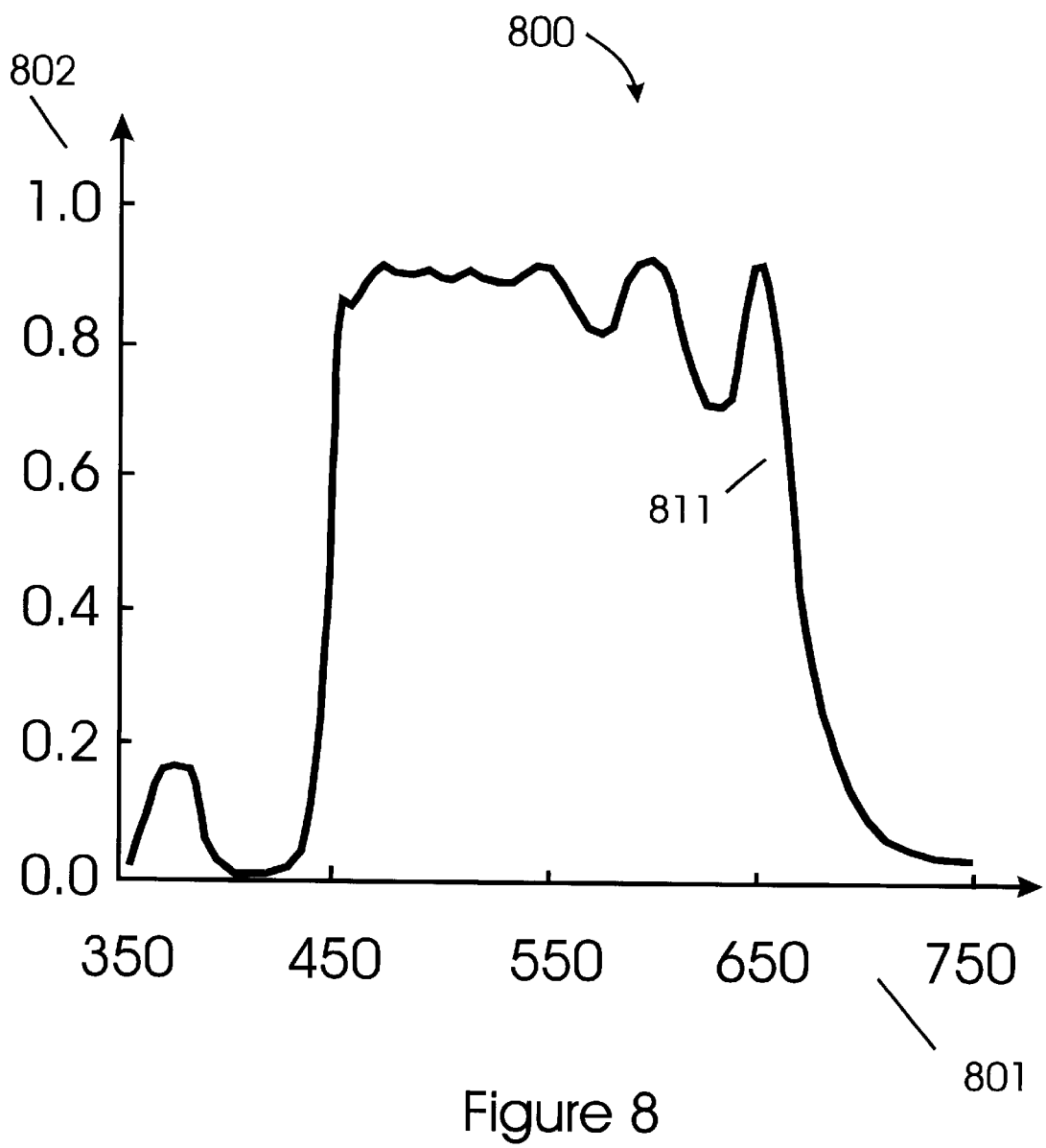
FIG. 8 illustrates the transmissivity versus wavelength for a dichronic mirror.

Violet-responsive solar cell 711 is well suited for use in double-pane windows 100, 200, and 500 for the type of dichronic mirror which reflects light of certain wavelengths and transmits light of other wavelengths, as depicted in FIG. 8. In FIG. 8, the transmission factor 802 of a particular dichronic mirror coating 811 is graphed versus wavelength 802. This dichronic mirror coating is available from Nikon, at microscopyu.com. In FIG. 8, the transmission factor 802 of 1.0 means 100%. The wavelength 802 is in nanometers. In FIG. 8, the reflectivity is equal to [1–transmissivity]. Thus, in FIG. 8, the dichronic mirror coating 811 reflects light shorter than 450 nanometers and longer than 680 nanometers. However, between 450 and 650 nanometers, dichronic mirror coating 811 transmits approximately 90% of the incoming light.

Using the dichronic coating 811 as dichronic coating 114 in FIG. 6, the light reflected to solar cells 120 in double-pane window 100, and solar cells 220 and 222 in double-pane windows 200 and 500, is of a wavelength shorter than 450 nm, which represents an energy higher than 2.76 electron volts. Violet-responsive solar cell 711 converts solar energy into DC electricity in this region higher than 2.76 electron volts, per FIG. 7.

Table 1 illustrates the ranges of wavelengths of visible light, in nanometers, and the electron volt energy. The electron volt energy is calculated by multiplying Planks constant, 4.136*10E-15 electron-volt-seconds by the speed of light 2.998*10E8 meters/second, and then dividing by the wavelength.

TABLE 1

Wavelengths of Visible Light

| Color | Range of Wavelength in nanometers | Range of Electron Volts |
| --- | --- | --- |
| Violet | 400–424 nm | 3.1–2.92 |
| Blue | 424–491 nm | 2.92–2.53 |
| Green | 491–575 nm | 2.53–2.16 |
| Yellow | 575–585 nm | 2.16–2.12 |
| Orange | 585–647 nm | 2.12–1.92 |
| Red | 647–700 nm | 1.92–1.77 |

Solar cell 711 is responsive in the violet region, which has a range of wavelengths between 400–424 nm, per Table 1. A preferred dichronic mirror coating in FIG. 8 is the commercially available Nikon V-1A filter, from microscopyu.com, which reflects wavelengths of light shorter than 450 nm and transmits wavelengths of light from 450 nm to approximately 680 nm, which includes blue, green, yellow, orange, and red wavelengths. Thus, the dichronic mirror coating in the Nikon V-1A filter transmits most of the visible light spectrum as light 132 in FIG. 1 and as light 232 in FIG. 2, while reflecting the violet and short-wavelength-blue light for the generation of electricity as light 131 onto surface 121 of solar cell 120 in FIGS. 1 and 3, and onto surfaces 221 and 223 of surfaces of solar cells 220 and 222 in FIGS. 2, 4, and 5.

An alternate dichronic coating 114 is available from pgo-online.com. This alternate form of dichronic coating 114 is 100% dielectric and achieves a nearly constant transmit:reflect ratio versus wavelength through the visible spectrum, 400 to 700 nanometers of wavelength. Transmit:reflect ratios of 30:70 (DST300), 50:50 (DST500), 60:40 (DST600), and 70:30 (DST700) are commercially available from pgo-online.com. For example, if dichronic coating 114 was chosen as 60:40 (DST600), then 60% of incoming light 130 in FIG. 1 would be transmitted through dichronic mirror 110 as light 132 into the building and 40% of incoming light 130 would be reflected as light 131 onto surface 121 of solar cell 120, and light 231 onto surfaces 221 and 223 of solar cells 220 and 222, for the generation of DC electricity. Thus, this alternate dichronic coating 114 is not wavelength specific and any commercially available solar cell could be used as solar cells 120, 220, and 222. This alternate dichronic coating 114 for dichronic mirror 110 of FIG. 1 and dichronic mirrors 210 and 212 of FIG. 2, would transmit all wavelengths of the visible spectrum to the inside of a building. Thus, it is the preferred coating 114 for dichronic mirrors 110, 210, and 212.

With either dichronic mirror coating, the inside of the building would not receive 100% of the outside light. However, current double-pane windows are tinted to reflect excess light, because receiving 100% of the outside light could overload cooling systems for large buildings. Thus, this invention converts the unwanted light into electricity, which saves money and is friendly to the environment.

Figure 9:
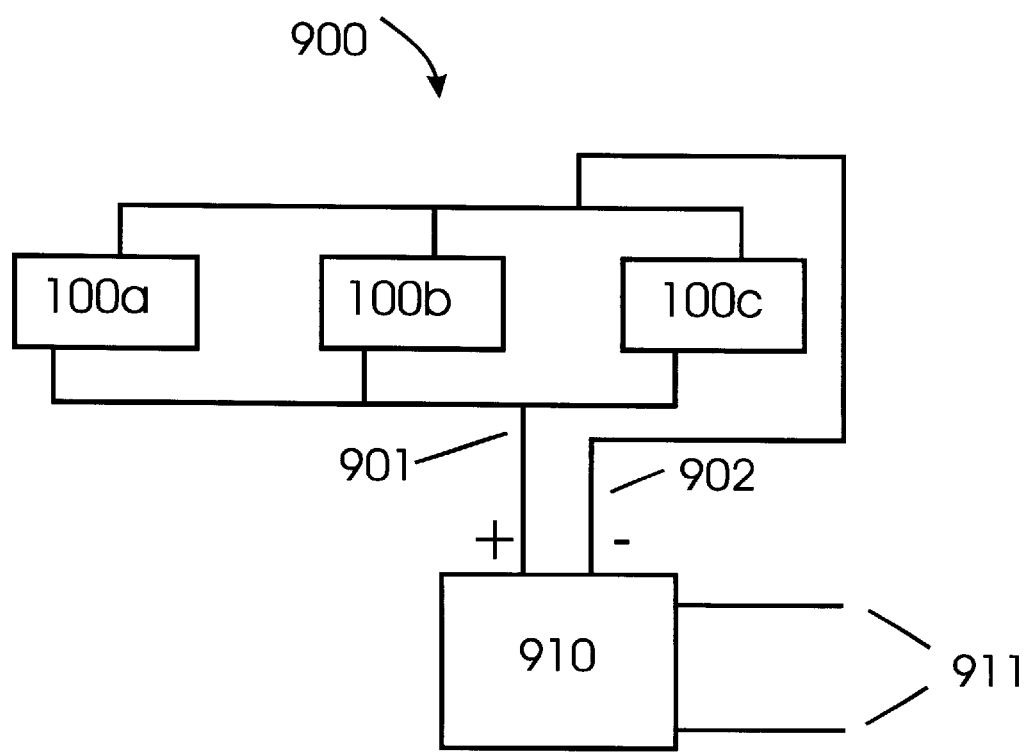
FIG. 9 illustrates an electrical connectivity diagram for a double-pane window with solar cells connected in series to increase voltage and solar cells connected in parallel to increase current.

FIG. 9 illustrates the electrical layout 900 for the conversion of direct current (DC) power from a plurality of solar cells into alternating current (AC) power. A plurality of solar cells depicted as solar cells 120a, 120b, 120c, and 120d generate DC current and voltage in double-pane window 100. Solar cells 120a and 120b are connected serially via conductor 912 to increase the DC voltage. Similarly, solar cells 120c and 120d are connected serially via conductor 822 to increase the DC voltage. Then, solar cells 120a, 120b and solar cells 120c, 120d are connected in parallel via conductors 901 and 903 to increase the DC current. Conductor 902 connects conductor 901 with connector 912 which is along the perimeter of double-pane window 100. Similarly, conductor 904 connects conductor 903 with connector 914 which is also located along the perimeter of double-pane window 100. Optional conducting shunt 913 could be removably attached to short out connectors 912 and 914, to protect solar cells 120a, 120b, 120c, and 120d in double-pane window 100 during manufacturing, shipping, and installation. Shunt 913 would then be removed immediately before connecting double-pane window 100 with the electrical load, if only DC power is needed, or with DC-to-AC converter 1010 in FIG. 10, if AC power is needed.

Figure 10:
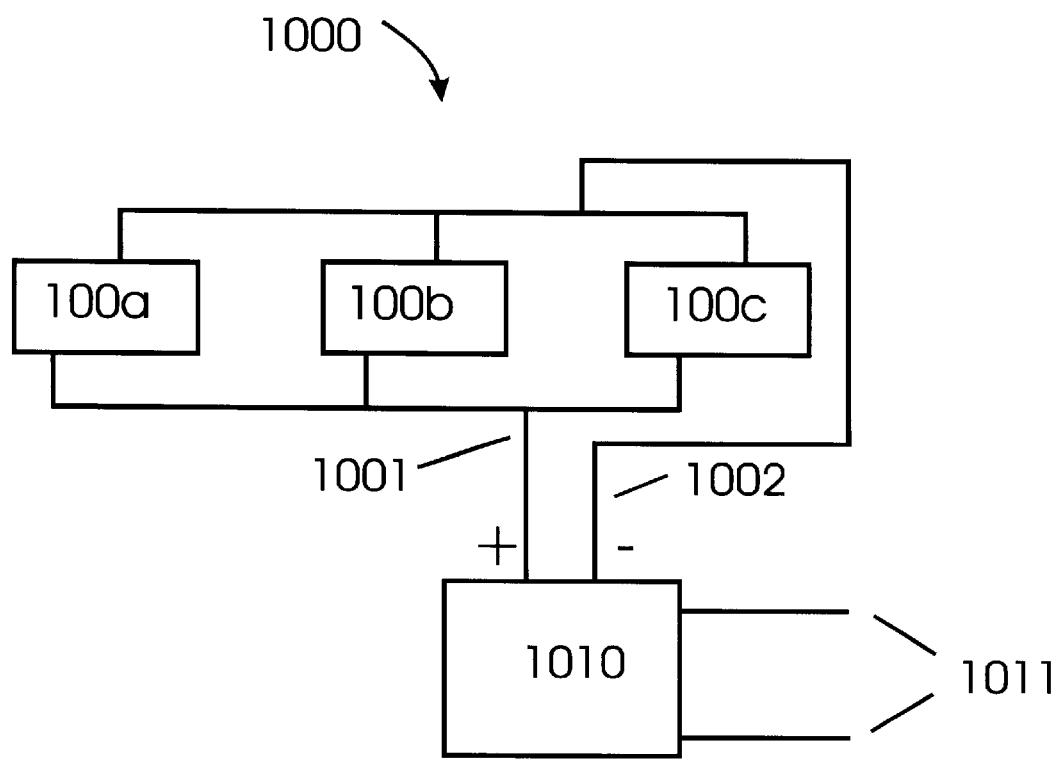
FIG. 10 illustrates double-pane windows connected to a DC-to-AC converter.

AC converter 1010 converts the DC current and voltage from solar cells for assembly 1000 of one or more double-pane windows 100a, 100b, and 100c, as shown in FIG. 10, into AC current and voltage which would then be fed into the AC power grid of the building via conductors 1011. The DC current and voltage from double-pane windows 100a, 100b, and 100c is fed to DC-to-AC converter 1011 by positive conductors 1001 and negative conductors 1002. The AC current and voltage output of DC-to-AC converter 1011 would preferably vary at a frequency of 60 Hertz (60 times a second) in the United States and preferably vary at a frequency of 50 Hertz in Europe. If the AC current and voltage output of DC-to-AC converter 1011 is being superimposed with purchased AC power from a utility, the phase of the AC current and voltage from DC-to-AC converter 1011 will have to match the phase of the AC current and voltage from the utility. In this manner, the solar generated DC electricity from windows 100, 200, and/or 500 is converted to usable AC electricity while windows 100, 200, and/or 500 still provide interior illumination and a view of the outside world.

While the invention has been shown and described with reference to a particular embodiment thereof, it will be understood to those skilled in the art, that various changes in form and details may be made therein without departing from the spirit and scope of the invention. For example, double-pane windows 100, 200, and/or 500 are described in the traditional sense as being in a vertical plane, which means to be along the side of a building. However, double-pane windows 100, 200, and/or 500 could equally be installed at an angle to the vertical, such as in a skylight.

What I claim is:

1. A double-pane window that generates electricity from light, comprising:
   a first and second pane, said panes are parallel to each other, said panes having a perimeter;
   a plurality of solar cells, said solar cells are mounted perpendicular to and between said first and second panes, each of said solar cells having a surface which receives a first portion of said light;
   a plurality of dichronic mirrors, said dichronic mirrors mounted between said first and second panes, each of said dichronic mirrors forming an acute angle with the surface of each of said solar cells, said dichronic mirrors reflecting the first portion of said light onto the surface of said solar cells, said dichronic mirrors transmitting a second portion of said light through said dichronic mirrors; and
   a first and second connectors, said connectors positioned on the perimeter of said double-pane window, each of said solar cells electrically connected to said connectors.

2. The double-pane window, as in claim 1, wherein:
   said panes are glass; and
   said panes are sealed along the perimeter.

3. The double-pane window, as in claim 1, wherein:
   said solar cells and said dichronic mirrors are arranged along the horizontal.

4. The double-pane window, as in claim 1, wherein:
   said solar cells and said dichronic mirrors are arranged along the vertical.

5. The double-pane window, as in claim 1, wherein:
   the acute angle between said dichronic mirrors and said solar cells ranges between 40 and 50 degrees.

6. The double-pane window, as in claim 1, wherein:
   the acute angle between said dichronic mirrors and said solar cells is 90 degrees minus half of the latitude of where said double-pane window is used.

7. The double-pane window, as in claim 1, further comprising:
   a DC-to-AC converter, said double-pane window is electrically connected to said DC-to-AC converter for the purpose of converting solar generated DC electricity into AC.

8. The double-pane window, as in claim 1, further comprising:
   a shunt, said shunt short-circuiting said connectors during the manufacture, shipping, and installation of said double-pane window.

9. The double-pane window, as in claim 1, wherein:
   said dichronic mirrors reflect light of a wavelength to the surface of said solar cells; and
   said dichronic mirrors transmit light of a different wavelength.

10. The double-pane window, as in claim 1, wherein:
    said dichronic mirrors maintaining a generally constant ratio between the light transmitted through said dichronic mirrors and reflected from said dichronic mirrors to the surface of said solar cells, throughout the spectrum of visible light.

11. A double-pane window, comprising:
    a plurality of solar cells, said solar cells are mounted within said double-pane window, each of said solar cells having a surface which receives a first portion of a light;
    a plurality of dichronic mirrors, said dichronic mirrors mounted within said double-pane window, each of said dichronic mirrors forming an acute angle with the surface of each of said solar cells, said dichronic mirrors reflecting the first portion of said light onto the surface of said solar cells, said dichronic mirrors transmitting a second portion of said light through said dichronic mirrors; and
    an electrical connector mounted to said double-pane window, said electrical connector connected to each of said solar cells.

12. The double-pane window, as in claim 11, wherein:
    said solar cells and said dichronic mirrors are arranged along the horizontal.

13. The double-pane window, as in claim 11, wherein:
    said solar cells and said dichronic mirrors are arranged along the vertical.

14. The double-pane window, as in claim 11, wherein:
    the acute angle between said dichronic mirrors and said solar cells ranges between 40 and 50 degrees.

15. The double-pane window, as in claim 11, wherein:
    the acute angle between said dichronic mirrors and said solar cells is 90 degrees minus half of the latitude of where said double-pane window is used.

16. A double-pane window that generates electricity from light, comprising:
    a first and second pane, said panes are parallel to each other, said panes having a perimeter;
    solar generating means to produce electricity mounted between said first and second panes, said solar generating means having a surface that receives a first portion of said light;
    beam splitting means to reflect the first portion of said light onto the surface of said solar generating means and transmitting a second portion of said light through said beam splitting means, said bean splitting means mounted between said first and second panes; and
    a first and second connectors, said connectors positioned on the perimeter of said double-pane window, each of said solar cells electrically connected to said connectors.

17. The double-pane window, as in claim 16, wherein:
    said solar generating means and said beam splitting means are arranged along the horizontal.

18. The double-pane window, as in claim 16, wherein:
    said solar generating means and said beam splitting means are arranged along the vertical.

* * * * *